(12) United States Patent
U'Ren

(10) Patent No.: US 6,365,479 B1
(45) Date of Patent: Apr. 2, 2002

(54) METHOD FOR INDEPENDENT CONTROL OF POLYCRYSTALLINE SILICON-GERMANIUM IN A SILICON-GERMANIUM HBT AND RELATED STRUCTURE

(75) Inventor: Gregory D. U'Ren, Corona del Mar, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/667,274

(22) Filed: Sep. 22, 2000

(51) Int. Cl.$^7$ ............................................. H01L 21/331
(52) U.S. Cl. ...................... 438/320; 438/47; 438/235; 438/312; 438/318
(58) Field of Search ........................ 438/235, 47, 312, 438/318, 320

*Primary Examiner*—Long Pham
(74) *Attorney, Agent, or Firm*—Farjami & Farjami LLP

(57) ABSTRACT

In one embodiment a precursor gas for growing a polycrystalline silicon-germanium region and a single crystal silicon-germanium region is supplied. The precursor gas can be, for example, $GeH_4$. The polycrystalline silicon-germanium region can be, for example, a base contact in a heterojunction bipolar transistor while the single crystal silicon-germanium region can be, for example, a base in the heterojunction bipolar transistor. The polycrystalline silicon-germanium region can be grown in a mass controlled mode at a certain temperature and a certain pressure of the precursor gas while the single crystal silicon-germanium region can be grown, concurrently, in a kinetically controlled mode at the same temperature and the same pressure of the precursor gas. The disclosed embodiments result in controlling the growth of the polycrystalline silicon-germanium independent of the growth of the single crystal silicon-germanium.

17 Claims, 3 Drawing Sheets

METHOD FOR INDEPENDENT CONTROL OF POLYCRYSTALLINE SILICON-GERMANIUM IN A SILICON-GERMANIUM HBT AND RELATED STRUCTURE

BACKGROUND OF THE INVENTION

1. Field of the Invention

The present invention relates to the field of fabrication of semiconductor devices. More specifically, the invention relates to the fabrication of silicon-germanium semiconductor devices.

2. Background Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 GHz have been if achieved for the HBT, which are comparable to the more expensive GaAs. Previously, silicon-only devices have not been competitive for use where very high speed and frequency response are required.

The higher speeds and frequency response of the HBT have been achieved as a result of taking advantage of the narrow band gap for silicon-germanium. The energy band gap of silicon-germanium is smaller than it is for silicon, lying between the intrinsic band gap of silicon (1.12 eV) and germanium (0.66 eV). The band gap is reduced further by the compressive strain in the alloy layer, with the band gap being reduced even further with increasing germanium content. The narrower band gap helps to increase the gain of the HBT by facilitating carrier injection across the emitter-base junction.

It is also known in the art that grading the concentration of germanium in the silicon-germanium base builds into the BBT device an electric field, which accelerates the carriers across the base, thereby increasing the speed of the HBT device compared to a silicon-only device. A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

Because the benefits of a high gain and high speed silicon-germanium HBT device can be either partially or completely negated by a high base contact resistance, it is important that the resistance of the base contact be kept to an absolute minimum. By way of background, a base contact may be provided by forming an electrical conductor in contact with the epitaxial silicon-germanium base region. Such a conductor is usually a composed either of a metal or polycrystalline semiconductor material. The choice of material is driven by several constraints and considerations. For example, it is not feasible to use a metal early in the fabrication for fear of contamination as well as practicality of integration. Also, the geometry of the base region may necessitate a contact of semiconductor material rather than metal. As such, it is often required to form a contact made of polycrystalline silicon-germanium to make an electrical connection with the single crystal silicon-germanium base. The process of fabricating the epitaxial or vertical transistor profile while simultaneously fabricating the poly-crystalline external base contact is known as a non-selective process. In other words, two critical components of the HBT structure are fabricated concurrently. Just as the physical properties of the single crystal silicon-germanium base are important in building a high-performance silicon-germanium HBT, attaining the optimum physical properties of the polycrystalline silicon-germanium material to serve as the external base contact is equally important to realize the inherent performance benefit offered by the HBT device.

In order to achieve satisfactorily low resistance in the base contact, it is required to control the thickness and morphology of the base contact polycrystalline material. At the same time, the processes that are used to control the attributes of the polycrystalline base contact material must not deleteriously affect the properties of the epitaxial base itself. Accordingly, a fabrication technique is needed to achieve independent control of the physical properties of the polycrystalline base contact, including thickness and morphology, while maintaining the physical properties of the epitaxial silicon-germanium base, in order to allow the formation of an optimum low-resistive conduction path to the base of the HBT.

According to one known technique of fabrication of heterojunction bipolar transistor devices, a relatively high processing temperature is used for silicon-germanium epitaxy in an RPCVD technique. The high temperature—higher than approximately 700° C.—sacrifices important control over the thickness and morphology of the base contact and, consequently, the resulting base contact resistance.

Thus, there is need in the art to retain important control over the resulting base contact resistance without sacrificing manufacturing throughput. There is further need in the art to decrease the base contact resistance of a heterojunction bipolar transistor device produced in the fabrication process while maintaining the desired dopant and germanium concentration profiles in the HBT. There is also need in the art to maintain the high throughput in the fabrication process when reducing the base contact resistance and while maintaining the desired dopant and germanium concentration profiles in the silicon-germanium base.

SUMMARY OF THE INVENTION

According to the present invention, important control over the properties of the base contact in a heterojunction bipolar transistor is achieved while maintaining the desired dopant and germanium concentration profiles in the heterojunction bipolar transistor.

In one embodiment of the invention a precursor gas for growing a polycrystalline silicon-germanium region and a single crystal silicon-germanium region is supplied. The precursor gas can be, for example, $GeH_4$. The polycrystalline silicon-germanium region can be, for example, a base contact in a heterojunction bipolar transistor while the single crystal silicon-germanium region can be, for example, a base in the heterojunction bipolar transistor.

The polycrystalline silicon-germanium region can be grown in a mass controlled mode at a certain temperature and a certain pressure of the precursor gas while the single crystal silicon-germanium region can be grown, concurrently, in a kinetically controlled mode at the same temperature and the same pressure of the precursor gas.

The invention results in controlling the growth of the polycrystalline silicon-germanium independent of the growth of the single crystal silicon-germanium. Accordingly, important control over the properties of the base contact in the heterojunction bipolar transistor is achieved while maintaining the desired dopant and germanium concentration profiles in the heterojunction bipolar transistor.

DETAILED DESCRIPTION OF THE INVENTION

The present invention is method for independent control of polycrystalline silicon-germanium in a silicon-germanium HBT and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
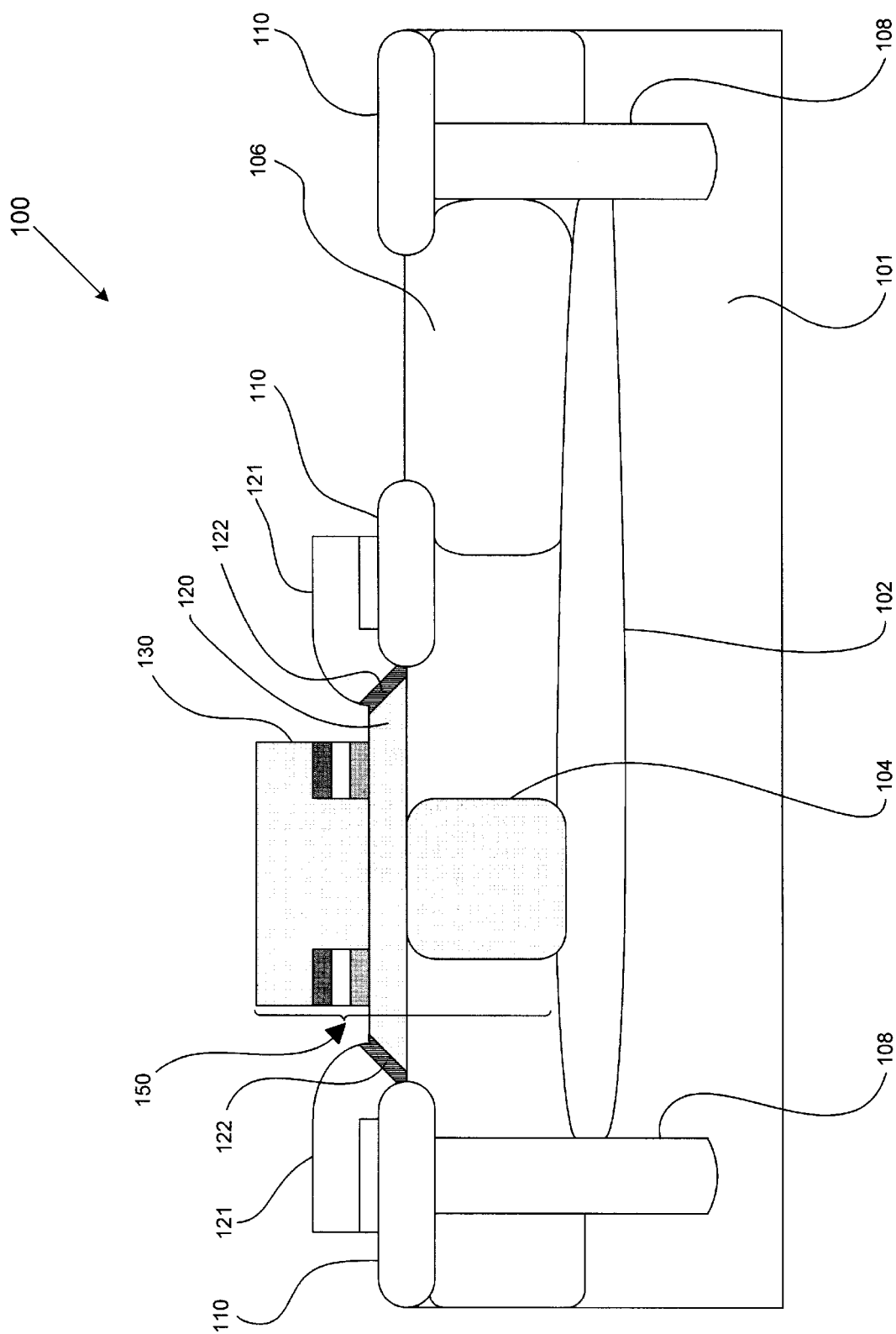
FIG. 1 illustrates a cross sectional view of some of the features of an NPN HBT fabricated in accordance with one embodiment of the present invention.

FIG. 1 shows a cross sectional view of various features and components of structure 100 which includes various features and components of an embodiment of the invention as described below. Certain details and features have been left out which are apparent to a person of ordinary skill in the art. Structure 100 includes collector 104, base 120, and emitter 130. Collector 104 is N-type single crystal silicon which can be deposited epitaxially using an RPCVD process in a manner known in the art. Base 120 is P-type silicon-germanium single crystal deposited epitaxially in a "nonselective" RPCVD process according to one embodiment of the invention as described below. As seen in FIG. 1, base 120 is situated on top of, and forms a junction with, collector 104. Base contact 121 is polycrystalline silicon-germanium deposited epitaxially in a "nonselective" RPCVD process according to one embodiment of the invention as described below. Base 120 and base contact 121 connect with each other at interface 122 between the contact polycrystalline material and the base single crystal material. Emitter 130 which is situated above and forms a junction with base 120 is comprised of N-type polycrystalline silicon. Collector 104, base 120, and emitter 130 thus form a heterojunction bipolar transistor ("HBT") which is generally referred to by numeral 150 in FIG. 1.

Buried layer 102, which is composed of N+type material—meaning that it is relatively heavily doped N-type material—along with collector sinker 106 (also referred to as collector plug 106) provide a low resistance electrical pathway from collector 104 to a collector contact (the collector contact is not shown in any of the Figures). Deep trench i structures 108 and silicon oxide ($SiO_2$) structures 110 provide electrical isolation from other devices on silicon substrate 101 in a manner known in the art.

Continuing with structure 100 in FIG. 1, buried layer 102 of N+type material in silicon substrate 101, deep trench structures 108, and silicon oxide structures 110 are formed in a manner known in the art. Collector sinker 106 is formed by diffusion of heavily concentrated dopants from the surface of collector sinker 106 down to buried layer 102. Collector sinker 106 provides part of a low resistance electrical path from collector 104 through buried layer 102 to the collector contact (not shown).

Figure 2:
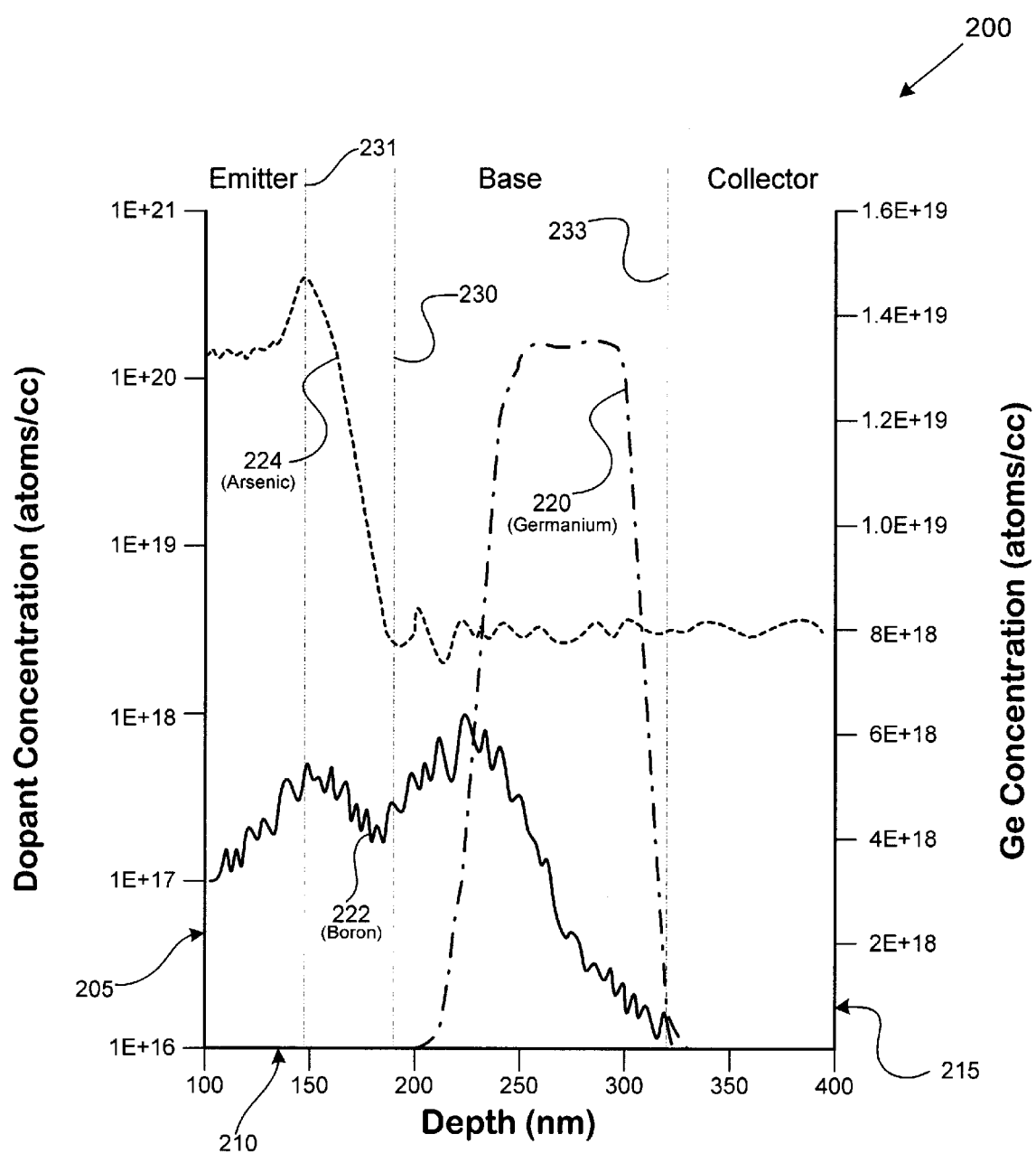
FIG. 2 illustrates the relative concentrations of dopants and germanium as a function of depth after completion of fabrication of an NPN HBT in accordance with one embodiment of the present invention.

By way of background, characteristics and functionality of HBT 150 are affected and can be tailored by varying the steps of the fabrication process. One useful tool for controlling the resultant performance characteristics of HBT 150 is the dopant and silicon-germanium profile. FIG. 2 shows one such profile for HBT 150 fabricated according to one embodiment of the present invention. It is desirable to accurately control the dopant and silicon-germanium profile of HBT 150 to achieve a desired HBT performance.

FIG. 2 shows graph 200 having dopant concentration axis 205, in atoms per cubic centimeter. Graph 200 also shows separate germanium concentration axis 215, in atoms per cubic centimeter. Both dopant concentration axis 205 and germanium concentration axis 215 are plotted against depth axis 210, measured in nanometers of depth from the top surface of HBT 150. As seen in graph 200 of FIG. 2, down to depth of approximately 190.0 nanometers corresponds to emitter 130 of HBT 150. This depth, i.e. the depth corresponding to emitter 130, is marked by dashed line 230 in graph 200 to indicate that the area between dashed line 230 and dopant concentration axis 205 corresponds to emitter 130 in FIG. 1.

Also, as seen in graph 200 of FIG. 2, from depth of approximately 190.0 nanometers down to depth of approximately 325.0 nanometers corresponds to the base of HBT 150. This base was shown as base 120 in HBT 150 in FIG. 1. This depth, i.e. the depth corresponding to base 120, is marked by dashed line 230 and by dashed line 233 to indicate that the area between dashed line 230 and dashed line 233 corresponds to base 120 in FIG. 1.

Further, as seen in graph 200 of FIG. 2, from depth of approximately 325.0 nanometers downward corresponds to the collector of HBT 150. The collector was shown as collector 104 in HBT 150 in FIG. 1. This depth, i.e. the depth corresponding to collector 104, is marked by dashed line 233 to indicate that the area between dashed line 233 and germanium concentration axis 215 corresponds to collector 104 in FIG. 1.

Germanium concentration curve 220 represents the concentration profile for germanium, and corresponds to germanium concentration axis 215. Boron concentration curve 222 represents the concentration profile for boron, and corresponds to dopant concentration axis 205. Arsenic concentration curve 224 represents the concentration profile for arsenic, and also corresponds to dopant concentration axis 205.

By understanding characteristic growth rates for silicon and silicon-germanium according to temperature, pressure, flow rate, and the effect of doping and dopants, as well as the effect of strain resulting from the epitaxial growth of silicon-germanium on top of silicon due to the difference between the two materials, the process of achieving the desired pre-determined profile can be controlled in order to produce a multilayer collector-base-emitter stack with the desired profile.

Referring to FIG. 1, the portion of multilayer stack structure comprising collector 104, base 120, and emitter 130 is formed as a result of several processes. Collector 104 can be formed by epitaxial deposition of silicon over silicon buried layer 102. Formation of collector 104 includes arsenic doping which results in an N-type layer. As stated above, the collector region is shown in graph 200 as the region confined between dashed line 233 and germanium concentration axis 215. By referring to dopant concentration axis 205 and arsenic concentration curve 224, it is seen that arsenic atoms have a concentration of approximately $5*10^{18}$ atoms per cubic centimeter in the collector region. It is also seen from graph 200 that boron atoms have a negligible concentration in the collector region. Accordingly, collector 104 is an "N-type" single crystal silicon.

A silicon seed layer is placed on top of collector 104 to maintain good crystallinity to aid growth of silicon-germanium above collector 104. Silicon-germanium, which will form part of base 120, is grown by epitaxy on top of the silicon seed layer. The concentration of germanium in the silicon-germanium layer comprising base 120 is graded by depth in the layer.

As stated above, base region is shown in graph 200 as the region confined between dashed line 230 and dashed line 233. Thus, in the present embodiment, the base region covers a depth of approximately 190.0 nanometers down to approximately 325.0 nanometers. By referring to dopant concentration axis 205 and arsenic concentration curve 224 in graph 200 it is seen that arsenic atoms have a concentration of approximately $5*10^{18}$ atoms per cubic centimeter in the base region. By referring to dopant concentration axis 205 and boron concentration curve 222, it is also seen that boron atoms have a concentration ranging from approximately $1*10^{16}$ to $1*10^{18}$ atoms per cubic centimeter. This concentration of boron atoms renders base 120, which is confined to a depth of approximately 190.0 nanometers to a depth of approximately 325.0 nanometers, a "P-type" base.

Dashed line 230 in graph 200, which marks the upper end of base 120 at a depth of approximately 190.0 nanometers in HBT 150, also corresponds to the emitter-base junction of HBT 150. A single crystal "silicon cap" occupies the region from slightly below the emitter-base junction, which is at a depth of approximately 190.0 nanometers, to a depth of approximately 150.0 nanometers indicated by dashed line 231 in graph 200, which is inside the emitter region.

From a depth of approximately 150.0 nanometers down to a depth of approximately 190.0 nanometers, i.e. within the silicon cap, the germanium concentration is 0.0%. The germanium concentration increases from 0.0% at a depth of approximately 190.0 nanometers to approximately 8.0% at a depth of approximately 250.0 nanometers as seen from germanium concentration curve 220. As further seen from germanium concentration curve 220, the germanium concentration remains relatively constant from a depth of approximately 250.0 nanometers to a depth of approximately 300.0 nanometers. From a depth of approximately 300.0 nanometers, the germanium concentration decreases from approximately 8.0% to approximately 0.0% at a depth of approximately 325.0 nanometers as shown by germanium concentration curve 220.

Thus, base 120 of HBT 150 comprises a graded single crystal silicon-germanium layer occupying a depth of from approximately 190.0 nanometers down to approximately 325.0 nanometers. As stated above, the graded single crystal silicon-germanium layer has a concentration ranging from approximately 0.0% to approximately 8.0%. The silicon-germanium graded layer also includes boron doping as shown by boron concentration curve 222. Because of the relative concentrations of arsenic and boron, discussed above, the graded single crystal silicon-germanium layer of base 120 is a P-type material.

The Emitter region is shown in graph 200 as the region confined between dashed line 230 and dopant concentration axis 205. Thus, in the present embodiment, the emitter region covers a depth of approximately 100.0 nanometers down to approximately 190.0 nanometers. It is sen from arsenic concentration curve 224 in graph 200 that arsenic, atoms have a concentration ranging from approximately $5*10^{18}$ to approximately $5*10^{20}$ atoms per cubic centimeter in emitter 130 of HBT 150. It is also seen from boron concentration curve 220 in graph 200 that boron atoms have a concentration ranging from approximately $1*10^{17}$ to $5*10^{17}$ atoms per cubic centimeter. This concentration of boron atoms in the emitter is much smaller than the concentration of arsenic atoms in the emitter. As such, the emitter region is an "N-type" region. The base-emitter junction, identified by dashed line 230 in graph 200, occurs just above the lower end of the single so crystal silicon cap. As stated above, the single crystal silicon cap, which includes the base-emitter junction, spans from a depth slightly below dashed line 230 and up to dashed line 231.

By way of background, during a chemical vapor deposition ("CVD") process used for epitaxially growing silicon-germanium, a gas containing a precursor for germanium and similarly for silicon flows across the silicon surface. For CVD processes, hydrides are used as these precursors. For example, for germanium the precursor is $GeH_4$. The precursor, such as $GeH_4$, is subjected to high temperatures. The precursor molecule, in this example $GeH_4$, usually attaches to an available silicon site. The germanium-hydrogen bond of the precursor hydride, at high enough temperature, will break apart. So given enough heat energy the hydrogen-germanium bonds break, the hydrogen is desorbed, and the germanium atom incorporates into the growing crystal. In one embodiment of the invention precursors containing germanium, for example $GeH_4$, as well as precursors containing silicon, for example $SiH_4$, are used to grow an epitaxial silicon-germanium crystal in base 120 of the HBT 150.

An important consideration in CVD growth of silicon-germanium is the strain produced from growing silicon-germanium crystal on top of a silicon crystal. It is desirable to grow silicon-germanium so as to keep the resulting strain between the silicon and germanium crystals below a critical level. Exposure of the epitaxially grown silicon-germanium to high temperature processing may result in partial to full strain relief via plastic flow between the silicon and silicon-germanium crystals. Should the strain energy exceed a critical threshold and the thermal processing promote the release of stored strain energy, the coherence of the epitaxial silicon-germanium structure with the silicon substrate is degraded. This event is electrically deleterious and would result in a loss of the advantages provided by the silicon-germanium HBT discussed above.

The requirement that the strain between the silicon substrate and silicon-germanium crystals should not exceed a critical level also results in a limitation that must be imposed on the thickness and concentration of germanium of the epitaxial silicon-germanium layer. For example, when the thickness of silicon-germanium layer exceeds a certain value for a particular germanium concentration, the strain between the silicon and silicon-germanium crystals would exceed a critical level, which is referred to as a critical thickness. As such, the amount of acceptable strain would define the critical thickness of the silicon-germanium layer. It is noted that an increase in germanium concentration also increases the strain between the silicon and silicon-germanium crystals. As such, it is important to maintain accurate control over processes used to grow the silicon germanium layer in base 120 independent of control over process parameters necessary to fabricate base contact 121 for HBT 150.

During the manufacturing process, the standard high temperature processing steps should not cause the strain between the silicon and silicon-germanium crystals to exceed a critical level. The higher the concentration of germanium, the lower is the operating temperature that needs to chosen to ensure the strain between the silicon and silicon-germanium crystals does not exceed a critical level. During the standard high temperature processing, excess dopant diffusion may also occur which would impair the silicon and silicon-germanium junction.

The present invention maintains the fabrication processing temperatures low to ensure the strain between the silicon and silicon-germanium crystals does not exceed a critical level. As described below, one embodiment of the present invention allows an 8.0% concentration of germanium without increasing the strain between the silicon and silicon-germanium crystals beyond a critical level. This is achieved while control over physical and electrical properties of the base contact is maintained because the fabrication processing temperatures are maintained low. This in turn results in maintaining higher yields in the manufacturing environment.

In one embodiment of the invention, the epitaxial deposition of silicon-germanium described above for forming base 120 is performed in a "nonselective process." In a nonselective process only a very small portion of the total area of the chip, for example 1.0%, has single crystal area exposed and suitable for epitaxial growth. The remainder of the area is covered with other layers, including but not limited to common masking materials such as amorphous silicon, for example $SiO_2$ or $Si_3N_4$. The nature of the precursors being used is such that deposition will occur not only on the exposed single crystal area, but also on the masking materials and other layers, which are amorphous. By way of contrast, selective area epitaxy is produced in situations where precursors can be chosen such that deposition will continue on an exposed semiconductor but not on amorphous silicon or common masking materials. Thus, in the nonselective process, as material is grown epitaxially in the single crystal region of base 120, other material is being deposited elsewhere on the amorphous surfaces. The material deposited on the amorphous surfaces, however, is not single crystal in structure, but either amorphous or polycrystalline. As discussed in more detail below, during the nonselective process of epitaxial growth used in one embodiment of the invention, base contact 121 is formed as a polycrystalline silicon-germanium material.

It is important, for reasons detailed above, that polycrystalline base contact 121 provide a low resistance connection to base 120. The importance of the formation of a low resistance base contact imposes several constraints on the resulting morphology of polycrystalline base contact 121. Moreover, desirable characteristics of a polycrystalline material include that it be conformal and smooth so that it is easy to deposit high integrity layers on top of the polycrystalline material. Furthermore, the thickness of the polycrystalline layer must be controlled. These constraints can be met by controlling various conditions in the polycrystalline deposition process, such as temperature, pressure, and precursor gas flow rate. However, prior to the present invention, it was difficult to control the polycrystalline deposition independently and the resulting properties of the deposited polycrystalline without affecting, often adversely, the profile and properties of the epitaxially grown single crystal silicon-germanium base.

Previously known methods using nonselective deposition were controlled by the constraints on the epitaxial single crystal silicon-germanium growth in base 120 of HBT 150, with the condition that whatever results were achieved for the polycrystalline characteristics had to be accepted. Otherwise, if it was desired to change the polycrystalline characteristics, the single crystal epitaxial silicon-germanium properties and profile were subject to change.

In general, maintaining the desired silicon-germanium profile and providing a low resistance base contact are two concerns in fabrication of HBT 150. In the nonselective epitaxial deposition of silicon-germanium used in one embodiment of the invention, single crystal growth in the exposed areas of silicon can occur in both a "mass controlled" growth mode and a "kinetically controlled" growth mode. Also, polycrystalline growth in the non-exposed areas can occur in both the "mass controlled" growth mode and the "kinetically controlled" growth mode.

Figure 3:
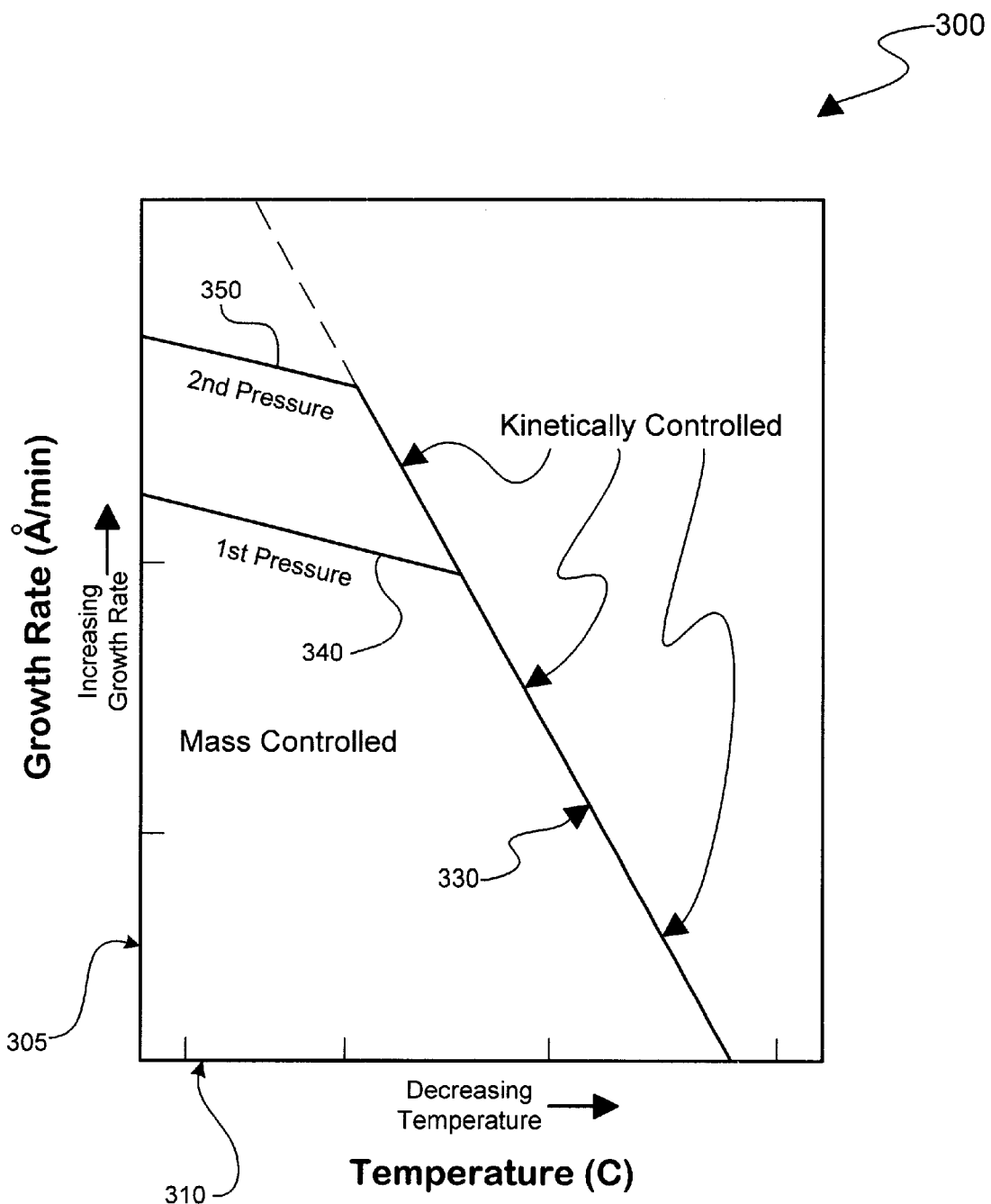
FIG. 3 illustrates silicon growth rates as a function of temperature and precursor gas pressure.

Graph 300 in FIG. 3 provides a framework for understanding the different mass controlled and kinetically controlled growth modes. The kinetically controlled growth mode is also known in the art as "site limited growth mode," and the mass controlled growth mode is also known in the art as "reactant limited growth mode." Graph 300 includes silicon growth rate axis 305, in angstroms per minute. Silicon growth rate axis 305 is plotted against temperature axis 310 measured in degrees Celsius. It is noted that the temperature indicated by axis 310 decreases in the direction away from the origin of graph 300.

Graph 300 describes silicon growth rate as a function of temperature and precursor gas pressure for the particular example of an RTCVD process for epitaxial deposition of single crystal silicon. The same type of measurements may be made for other CVD processes and for polycrystalline as well as single crystal growth. For example, measurements may be made for the RPCVD used in the embodiment of the present invention described here. For epitaxial single crystal growth in the RPCVD example, the measurements would produce a graph similar to graph 300 but with different specific numerical values for the pressure and for the growth rate on silicon growth rate axis 305 and for temperature axis 310. For polycrystalline growth in the RPCVD example, the measurements would produce yet another graph similar to graph 300 but with still different specific numerical values for the pressure and for the growth rate on silicon growth rate axis 305 and for temperature axis 310. The specific numerical values for the growth rate, temperature, and pressure thus depends on the type of CVD and whether single crystal or polycrystalline material is being grown. However, the general behavior of growth rate as a function of temperature or pressure has a pattern similar to that shown in graph 300, independent of the type of CVD and whether single crystal or polycrystalline material is being grown. It is also noted that growth of germanium using an appropriate precursor gas, such as $GeH_4$, behaves similar to the silicon growth shown in graph 300. Therefore, graph 300 is intended for use as a general guide to illustrate the concepts and, as such, no specific numerical values have been indicated in graph 300.

At lower temperatures, growth rate is a strong function of the temperature value, so that the amount of the precursor gas and the precursor gas pressure are less determinative of growth rate. This is called the kinetically controlled growth mode, since the growth is dependent primarily on temperature. Kinetically controlled growth mode is shown in graph 300 as line 330.

As the temperature increases, the growth rate becomes a stronger function of the amount of the precursor gas and the precursor gas pressure. In other words, the growth rate becomes a stronger function of the amount of the precursor gas present and the precursor gas pressure. Conversely, the growth rate becomes a weaker function of temperature. This is the mass controlled growth mode. Mass controlled growth mode is shown in graph 300, for example, as line 340, for growth at a lower pressure, "1st pressure." Mass controlled growth mode is also shown in graph 300, for example, as line 350, for growth at a higher pressure, "2nd pressure." The two examples depicted by line 340 and line 350, illustrate that growth rate in the mass controlled growth mode increases with increasing pressure.

A simplified illustration of each of the mass controlled and kinetically controlled growth modes can be provided by considering the primary limitation in each growth mode on the chemical reaction comprising deposition. In the mass controlled growth mode, there is sufficient heat energy to deposit substantially all the germanium (or silicon) being carried by the precursor gas. Deposition in the mass controlled growth mode is thus limited by the mass and pressure of the precursor gas. Conversely, in the kinetically controlled growth mode, there is not sufficient heat energy to deposit all the precursor gas provided. Deposition in the kinetically controlled growth mode is thus limited by the breaking up or desorption of hydrogen from the silicon-germanium crystal, i.e. by the kinetic energy (i.e. the heat energy) available to break the chemical bonds in the precursor gas.

For the embodiment of the present invention described here, single crystal silicon-germanium base 120 is grown by epitaxial deposition process in the kinetically controlled growth mode. As discussed above, crystal growth in this mode is relatively insensitive to the pressure and precursor gas flow rate. This mode may be operated at a relatively wide range of temperatures, but an upper limit for the temperature is determined by the tendency of higher temperatures to cause strain to exceed a critical level, as discussed above.

For the embodiment of the present invention herein described, polycrystalline silicon-germanium base contact 121 is grown by an RPCVD process in the mass controlled growth mode. As stated above, polycrystalline growth of silicon-germanium follows the same fundamental behavior shown in FIG. 3, but the operating values for the temperature and pressure parameters are shifted. For example, the mass controlled growth mode for polycrystalline silicon-germanium occurs at a lower temperature in comparison with the temperature at which mass controlled growth mode for single crystal silicon-germanium occurs.

Thus the transition from the kinetically controlled growth mode to the mass controlled growth mode occurs at a lower temperature for the polycrystalline silicon-germanium. It follows that polycrystalline silicon-germanium growth may be conducted in the mass controlled growth mode at temperatures which would correspond to the kinetically controlled growth mode for single crystal silicon-germanium. The present invention takes advantage of the fact that the polycrystalline growth in the mass controlled growth mode is a stronger function of pressure and precursor gas flow rate to achieve control over polycrystalline silicon-germanium growth in base contact 121 independent of the single crystal silicon-germanium growth in base 120. In other words, the polycrystalline silicon-germanium growth can occur without causing substantial growth in base 120 at lower temperatures. Thus, at lower temperatures, for example at 650° C., the invention achieves growth of polycrystalline silicon-germanium in base contact 121 without causing a substantial growth in single crystal silicon-germanium base 120.

At higher pressure and temperature, more polycrystalline growth occurs. At lower pressure and temperature, there is more amorphous deposition. For pressures in the range of approximately 200.0 Torr down to approximately 100.0 Torr, the growth is polycrystalline. At approximately 75.0 Torr, the growth becomes more amorphous. The desirability of achieving more polycrystalline than amorphous growth sets a lower limit on the operating temperature. The present embodiment of the invention uses a temperature of approximately 650° C. and a pressure of approximately 100.0 Torr. At approximately 650° C. at 100.0 Torr, single crystal silicon-germanium growth in base 120 of HBT 150 is soundly in the kinetically controlled growth mode and occurs at a much lower rate compared with the growth of polycrystalline silicon-germanium in base contact 121 which occurs at a much higher rate in the mass controlled mode.

Under conditions where the single crystal growth is in the kinetically controlled growth mode and polycrystalline growth is in the mass controlled growth mode, it is possible to supply the precursor gas at a wide range of volume. In the particular embodiment of the invention described here, it is possible to vary precursor gas in a range from approximately 100.0 SCCm (standard cubic centimeters) up to approximately 400.0 SCCm. For precursor gas flow rates in this range, the epitaxial growth rates for the single crystal silicon-germanium are not significantly affected. The polycrystalline growth rates, on the other hand, vary almost linearly as a function of the precursor gas flow volume in this range.

Thus, the present invention achieves control over the ratio of polycrystalline silicon-germanium base contact 121 deposition rate to single crystal silicon-germanium base 120 deposition rate. This ratio is referred to as "the deposition ratio" in the present application. At the temperatures and pressures previously used, approximately 725° C. at 100.0 Torr, the deposition ratio of single crystal base 120 to polycrystalline base contact 121 was approximately one to one. That is, the single crystal material and the polycrystalline material deposited at nearly the same rate. The present invention achieves control over the deposition ratio and achieves a one to two deposition ratio, i.e. the polycrystalline silicon-germanium in base contact 121 grows twice as fast as the single crystal silicon-germanium in base 120. Further, the properties of polycrystalline deposition can be independently controlled by suitable choices of physical conditions of the process including temperature and pressure.

The properties of the polycrystalline deposition over which control is gained include the thickness of the deposition and also the structure in terms of how much of the deposition is polycrystalline and how much is amorphous or unstructured deposition. These two properties directly affect the resistance of the polycrystalline deposition and thereby polycrystalline base contact 121. Increased thickness lowers the resistance and also improves the crystal structure gained by increasing the proportion of polycrystalline material over amorphous. The control of properties of the polycrystalline deposition for polycrystalline base contact 121 results in maintaining the advantages of silicon-germanium HBT 150. In other words, the advantageous properties of HBT device 150 including the gain, speed, and frequency response are maintained.

For application to the particular HBT structure 150 herein described, the temperature and pressure conditions were approximately 650° C. at 100 Torr. By application of the invention to HBT 150, the base contact resistance is reduced from values of approximately 1000 ohms per micrometer to approximately 600 ohms per micrometer, i.e. a 40% reduction.

As described above, present invention allows an 8.0% concentration of germanium without increasing the strain between the silicon and silicon-germanium crystals beyond a critical level. Accordingly, the invention maintains higher yield in the manufacturing environment since the strain does not exceed a critical level. This is achieved while control over physical and electrical properties of the base contact is maintained.

It is appreciated by the above detailed disclosure that the invention provides a method for controlling the deposition of polycrystalline material independently of the deposition of single crystal material in a silicon-germanium nonselective epitaxial process. Using the invention, various important properties of the base contact in an HBT can be controlled and improved. Although the invention is described as applied to the construction of a heterojunction bipolar transistor, it will be readily apparent to a person of ordinary skill in the art how to apply the invention in similar situations where control is needed of polycrystalline properties of silicon-germanium independent of effects on single crystal silicon-germanium growth.

From the above description of the invention it is manifest that various techniques can be used for implementing the concepts of the present invention without departing from its scope. For example, although the CVD process used in the particular embodiment of the present invention described here is the reduced pressure, or RPCVD, other types of CVD techniques known in the art could be used without departing from the scope of the present invention. These types of CVD techniques may include ultra high vacuum CVD (UHVCVD), atmospheric pressure CVD (APCVD), and rapid thermal CVD (RTCVD). Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for independent control of polycrystalline silicon-germanium in a silicon-germanium HBT and related structure have been described.

What is claimed is:

1. A method comprising steps of:
   supplying a precursor gas for growing a polycrystalline silicon-germanium region and a single crystal silicon-germanium region;
   growing said polycrystalline silicon-germanium region in a mass controlled mode at a first pressure of said precursor gas and a first temperature;
   growing said single crystal silicon-germanium region in a kinetically controlled mode at said first pressure of said precursor gas and said first temperature.

2. The method of claim 1 wherein said precursor gas comprises germanium and hydrogen.

3. The method of claim 1 wherein said polycrystalline silicon-germanium region is in contact with said single crystal silicon-germanium region.

4. The method of claim 1 wherein said polycrystalline silicon-germanium region is a base contact in a heterojunction bipolar transistor.

5. The method of claim 1 wherein said single crystal silicon-germanium region is a base in a heterojunction bipolar transistor.

6. The method of claim 1 wherein said first pressure is approximately 100 Torr.

7. The method of claim 1 wherein said first temperature is approximately 650° C.

8. The method of claim 1 wherein said single crystal silicon-germanium region comprises approximately 8% germanium and 92% silicon.

9. The method of claim 1 wherein said polycrystalline silicon-germanium region grows approximately twice as fast as said single crystal silicon-germanium region.

10. A method for fabricating a heterojunction bipolar transistor, said method comprising steps of:
    growing a collector in a silicon substrate;
    growing in a kinetically controlled mode a single crystal silicon-germanium base forming a junction with said collector;
    growing in a mass controlled mode a polycrystalline silicon-germanium base contact for electrical connection to said base;
    growing a polycrystalline silicon emitter forming a junction with said base.

11. The method of claim 10 wherein said growing in said kinetically controlled mode is performed concurrently with said growing in said mass controlled mode.

12. The method of claim 10 further comprising a step of supplying a precursor gas prior to said step of growing in said kinetically controlled mode.

13. The method of claim 12 wherein said precursor gas comprises hydrogen and germanium.

14. The method of claim 12 wherein said step of growing in said kinetically controlled mode and said step of growing in said mass controlled mode are performed at a pressure of approximately 100 Torr and a temperature of approximately 650° C.

15. The method of claim 10 wherein said base comprises approximately 8% germanium and 92% silicon.

16. The method of claim 10 wherein said polycrystalline silicon-germanium base contact grows approximately twice as fast as said single crystal silicon-germanium base.

17. The method of claim 10 wherein said base contact has a resistance of approximately 650 ohms per micrometer.

* * * * *